(12) United States Patent
Iwai et al.

(10) Patent No.: US 8,922,786 B2
(45) Date of Patent: Dec. 30, 2014

(54) DETECTOR, IMPRINT APPARATUS, AND ARTICLE MANUFACTURING METHOD

(71) Applicant: Canon Kabushiki Kaisha, Tokyo (JP)

(72) Inventors: Toshiki Iwai, Utsunomiya (JP);
Kazuhiko Mishima, Utsunomiya (JP);
Hironori Maeda, Utsunomiya (JP); Ken Minoda, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 99 days.

(21) Appl. No.: 13/653,434

(22) Filed: Oct. 17, 2012

(65) Prior Publication Data
US 2013/0100459 A1    Apr. 25, 2013

(30) Foreign Application Priority Data

Oct. 21, 2011   (JP) ................................. 2011-232121
Oct. 2, 2012    (JP) ................................. 2012-220718

(51) Int. Cl.
*G01B 11/02*    (2006.01)
*G01D 5/38*     (2006.01)
*G03F 7/00*     (2006.01)
*G01D 5/347*    (2006.01)

(52) U.S. Cl.
CPC .............. *G01D 5/38* (2013.01); *G01D 5/34715* (2013.01); *G03F 7/0002* (2013.01); *G03F 7/00* (2013.01)
USPC ........................................................ 356/499

(58) Field of Classification Search
USPC .......................................... 356/488, 494, 499
See application file for complete search history.

(56) References Cited

U.S. PATENT DOCUMENTS

| 4,815,850 A * | 3/1989 | Kanayama et al. ........... 356/488 |
| 5,943,135 A | 8/1999 | Mishima |
| 6,151,121 A | 11/2000 | Mishima |
| 6,654,128 B2 * | 11/2003 | Takayama et al. ............ 356/499 |
| 6,707,533 B2 | 3/2004 | Mishima |

(Continued)

FOREIGN PATENT DOCUMENTS

| JP | 6-94421 A | 4/1994 |
| JP | 7-130614 A | 5/1995 |

(Continued)

OTHER PUBLICATIONS

Partial English translation of Japanese Office Action dated Oct. 3, 2014, issued in counterpart Japanese Patent Application No. 2012-220718.

*Primary Examiner* — Michael A Lyons
(74) *Attorney, Agent, or Firm* — Fitzpatrick, Cella, Harper & Scinto

(57) ABSTRACT

A detector includes an illumination optical system that illuminates a first diffraction grating having a period in each of a first direction and a second direction different from the first direction, and a second diffraction grating having a period in the second direction different from the period of the first diffraction grating in the second direction. A detection optical system detects diffracted light diffracted by the first diffraction grating and the second diffraction grating. The detection optical system includes a photoelectric conversion element and a guide portion arranged on a pupil plane of the detection optical system. The guide portion guides, to the photoelectric conversion element, the light diffracted by the first diffracting grating and the second diffraction grating. The diffracted light diffracted by the second diffraction grating enters a position different from the guide portion on the pupil plane of the detection optical system.

23 Claims, 11 Drawing Sheets

(56) References Cited

U.S. PATENT DOCUMENTS

| | | |
|---|---|---|
| 6,870,623 B2 | 3/2005 | Tanaka et al. |
| 6,930,016 B2 | 8/2005 | Mishima et al. |
| 7,019,836 B2 | 3/2006 | Mishima |
| 7,142,284 B2 | 11/2006 | Mishima |
| 7,230,706 B2 | 6/2007 | Mishima |
| 7,292,326 B2 | 11/2007 | Nimmakayala et al. |
| 7,630,067 B2 | 12/2009 | Nimmakayala et al. |
| 7,785,096 B2 | 8/2010 | Nimmakayala et al. |
| 7,880,872 B2 | 2/2011 | Nimmakayala et al. |
| 2007/0231421 A1 | 10/2007 | Nimmakayala et al. |
| 2008/0304058 A1* | 12/2008 | Heiden ........................ 356/237.5 |
| 2009/0147237 A1 | 6/2009 | Schumaker et al. |
| 2012/0328725 A1* | 12/2012 | Minoda et al. ................. 425/150 |

FOREIGN PATENT DOCUMENTS

| | | |
|---|---|---|
| JP | H09-189520 A | 7/1997 |
| JP | 2003-068613 A | 3/2003 |
| JP | 2008-522412 A | 6/2008 |
| JP | 2011-509516 A | 3/2011 |
| WO | 2007/046820 A2 | 4/2007 |

* cited by examiner

DETECTOR, IMPRINT APPARATUS, AND ARTICLE MANUFACTURING METHOD

CLAIM OF PRIORITY

This application claims the benefit of Japanese Patent Application No. 2011-232121, filed Oct. 21, 2011, and No. 2012-220718, filed Oct. 2, 2012, which are hereby incorporated by reference herein in their entirety.

BACKGROUND OF THE INVENTION

1. Field of the Invention

The present invention relates to a detector for detecting the relative positions of two different objects, and to an imprint apparatus, and an article manufacturing method.

2. Description of the Related Art

As demands for the micropatterning of semiconductor devices advance, a micropatterning technique of forming a resin pattern on a substrate by molding an uncured resin on the substrate by using a mold is attracting attention, in addition to conventional photolithography techniques. The micropatterning technique is also called an imprint technique, and is capable of forming a microstructure of a few nm order on a substrate. An example of the imprint technique is a photo-curing method. In an imprint apparatus using this photo-curing method, a shot as an imprint region on a substrate is first coated with an uncured ultraviolet-curing resin (an imprint resin or a light curable resin) (the resin is dispensed on the shot). Then, this resin is molded by using a mold. After the resin is cured by ultraviolet irradiation, the mold is released, thereby forming a resin pattern on the substrate.

An imprint apparatus matching this photo-curing method is disclosed in, for example, Japanese Patent Laid-Open No. 2008-522412. This imprint apparatus includes a substrate holding stage, a resin coating mechanism, an imprint head, an ultraviolet radiation unit, and an alignment mark detector. In this imprint apparatus, a substrate and a mold are aligned by using a so-called, die-by die method by which, when pressing the substrate and the mold against each other, marks formed on the substrate and the mold are simultaneously observed for each shot, and a shift between the marks is corrected.

In the imprint apparatus disclosed in Japanese Patent Laid-Open No. 2008-522412, alignment marks are formed on a mold and a substrate. The mark on the mold includes a grating pattern having a grating pitch in a measurement direction. The mark on the substrate includes a checkerboard grating pattern having a grating pitch in each of the measurement direction and a direction (non-measurement direction) perpendicular to the measurement direction. An illumination optical system for illuminating the marks and a detection optical system for detecting diffracted light from the marks are inclined from a direction perpendicular to the mold and the substrate toward the non-measurement direction. That is, the illumination optical system is designed so as to obliquely illuminate the marks in the non-measurement direction. Light obliquely incident on the marks is diffracted in the non-measurement direction by a checkerboard grating pattern formed on the substrate, and the detection optical system detects only diffracted light having a specific order, other than the 0th order in the non-measurement direction.

Also, the grating pitch of the grating pattern formed on the mold and that of the grating pattern formed on the substrate are slightly different in the measurement direction. When these grating patterns having different grating pitches are overlaid, the interference between diffracted light components from the two grating patterns forms an interference fringe (a so-called moire fringe) having a period reflecting the difference between the grating pitches of the grating patterns. Since the phase of this moire fringe changes in accordance with the positional relationship between the grating patterns, the substrate and the mold can be aligned by observing the phase of the moire fringe. A method of detecting relative positions by using the moire fringe as described above has the advantage that alignment can be performed with a high accuracy even when using a detection optical system having a low resolving power.

The detector disclosed in Japanese Patent Laid-Open No. 2008-522412 detects light diffracted in the non-measurement direction by the checkerboard grating pattern formed on the substrate, in a direction not perpendicular to the mold or the substrate. Therefore, a single detector (an illumination optical system and a detection optical system) cannot acquire information on the relative positions of the mold and the substrate in a plurality of directions.

SUMMARY OF THE INVENTION

The present invention accurately detects the relative positions of two objects in two directions by using a single detector.

The present invention, in its first aspect, provides a detector for detecting relative positions of a first object and a second object in an x direction and a y direction, the detector comprising an illumination optical system configured to illuminate a first mark arranged on the first object, and a second mark arranged on the second object, and a detection optical system configured to detect interfering light of diffracted light components diffracted by the first mark and the second mark illuminated by the illumination optical system, wherein one of the first mark and the second mark includes a grating pattern having a grating pitch $P_1$ in the y direction and a grating pitch $P_2$ in the x direction, and the other one of the first mark and the second mark includes a grating pattern having a grating pitch $P_3$ in the x direction, the illumination optical system forms, in a pupil plane thereof, a light intensity distribution including a first pole in the y direction and a second pole in the x direction, and diffracted light components generated when light illuminated from the first pole is diffracted by the first mark and the second mark are incident on an aperture of the detection optical system in the pupil plane, and diffracted light components generated when light illuminated from the second pole is diffracted by the first mark and the second mark are incident on a place different from the aperture of the detection optical system in the pupil plane.

The present invention, in its second aspect, provides a detector for detecting interfering light of diffracted light components diffracted by marks formed on a first object and a second object, the detector comprising an illumination optical system configured to form an intensity distribution including a first pole and a second pole that illuminates a first mark arranged on the first object, and a second mark arranged on the second object, and a detection optical system configured to detect interfering light of light components diffracted by the first mark and the second mark illuminated by the illumination optical system, wherein the detection optical system detects interfering light of diffracted light components generated when light of the first pole is radiated on and diffracted by the first mark and the second mark, and the detection optical system does not detect diffracted light components generated when light of the second pole is radiated on and diffracted by the first mark and the second mark.

The present invention, in its third aspect, provides an imprint apparatus for pressing a pattern surface of a mold against a resin with which a substrate is dispensed, curing the resin, and forming a pattern of the cured resin on the substrate, the apparatus comprising a detector to detect the first mark and the third mark arranged on the mold, and the second mark and the fourth mark arranged on the substrate, wherein the detector detects relative positions of a first object and a second object in an x direction and a y direction, the detector including an illumination optical system configured to illuminate a first mark arranged on the first object, and a second mark arranged on the second object, and a detection optical system configured to detect interfering light of diffracted light components diffracted by the first mark and the second mark illuminated by the illumination optical system, one of the first mark and the second mark including a grating pattern having a grating pitch $P_1$ in the y direction and a grating pitch $P_2$, in the x direction, and the other one of the first mark and the second mark including a grating pattern having a grating pitch $P_3$ in the x direction, the illumination optical system forms, in a pupil plane thereof, a light intensity distribution including a first pole in the y direction and a second pole in the x direction, and diffracted light components generated when light illuminated from the first pole is diffracted by the first mark and the second mark are incident on an aperture of the detection optical system in the pupil plane, and diffracted light components generated when light illuminated from the second pole is diffracted by the first mark and the second mark are incident on a place different from the aperture of the detection optical system in the pupil plane.

The present invention, in its fourth aspect, provides a method of manufacturing an article, the method comprising forming a pattern on a substrate using an imprint apparatus, and processing the substrate on which the pattern is formed in the forming, to manufacture the article, wherein the imprint apparatus presses a pattern surface of a mold against a resin with which a substrate is dispensed, cures the resin, and forms a pattern of the cured resin on the substrate. The imprint apparatus includes a detector to detect the first mark and the third mark arranged on the mold, and the second mark and the fourth mark arranged on the substrate. The detector detects relative positions of a first object and a second object in an x direction and a y direction, the detector including an illumination optical system configured to illuminate a first mark arranged on the first object, and a second mark arranged on the second object, and a detection optical system is configured to detect interfering light of diffracted light components diffracted by the first mark and the second mark illuminated by the illumination optical system. One of the first mark and the second mark includes a grating pattern having a grating pitch $P_1$ in the y direction and a grating pitch $P_2$ in the x direction, and the other one of the first mark and the second mark includes a grating pattern having a grating pitch $P_3$ in the x direction. The illumination optical system forms, in a pupil plane thereof, a light intensity distribution including a first pole in the y direction and a second pole in the x direction, and diffracted light components generated when light illuminated from the first pole is diffracted by the first mark and the second mark are incident on an aperture of the detection optical system in the pupil plane, and diffracted light components generated when light illuminated from the second pole is diffracted by the first mark and the second mark are incident on a place different from the aperture of the detection optical system in the pupil plane.

Further features of the present invention will become apparent from the following description of exemplary embodiments with reference to the attached drawings.

DESCRIPTION OF THE EMBODIMENTS

Embodiments for carrying out the present invention will be explained below with reference to the accompanying drawings.

First Embodiment

Figure 11:
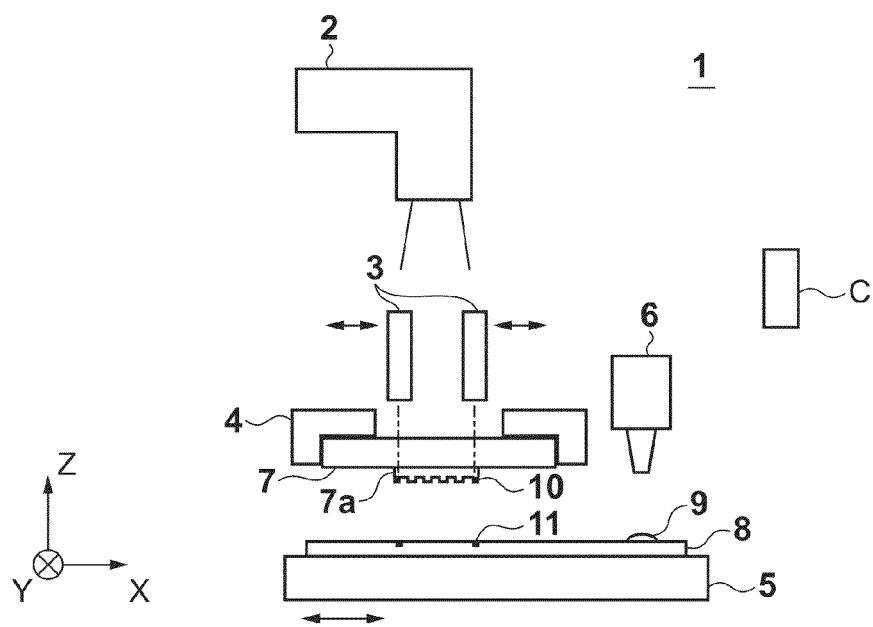
FIG. 11 is a view showing an imprint apparatus according to the first embodiment.

An imprint apparatus according to the first embodiment will be explained with reference to FIG. 11. An imprint apparatus 1 is used in the manufacture of devices such as semiconductor devices. In the imprint apparatus 1, an uncured resin (imprint material) 9 on a substrate (wafer) 8 is molded by using a mold 7, thereby forming a pattern of the resin 9 on the substrate 8. Note that the imprint apparatus 1 of this embodiment uses a photo-curing method. Note also that, in the following drawings, the x- and y-axes are taken in a plane parallel to the surface of the substrate 8, and the z-axis is taken in a direction perpendicular to the x- and y-axes. The imprint apparatus 1 includes an ultraviolet radiation unit 2, detectors 3, a mold holder 4, a substrate stage 5, and a coating unit (dispenser) 6.

After an imprinting process of bringing the mold 7 into contact with the resin 9 on the wafer 8, the ultraviolet radiation unit 2 irradiates the mold 7 with ultraviolet light in order to cure the resin 9. Although not shown, the ultraviolet radiation unit 2 includes a light source, and a plurality of optical elements for uniformly irradiating a pattern surface 7a of the mold 7 with ultraviolet light emitted from the light source and having a predetermined shape. In particular, the region irradiated with light by the ultraviolet radiation unit 2 is desirably equivalent to or slightly larger than the surface area of the pattern surface 7a. This is so because, when the ultraviolet irradiation region is a minimum necessary region, it is possible to prevent the mold 7 or wafer 8 from expanding due to the heat of irradiation, thereby preventing a positional shift or distortion of a pattern to be transferred to the resin 9. In addition, it is possible to prevent an operation error that can occur later in the coating unit 6 (to be described later) if ultraviolet light reflected by the wafer 8, or the like, reaches the coating unit 6 and cures the resin 9 remaining in a discharge portion of the coating unit 6.

As the light source, it is possible to use, for example, a high-pressure mercury lamp, excimer lamps, an excimer laser, or a light-emitting diode. Although the light source is properly selected in accordance with the characteristics of the resin 9, the present invention is not limited by, for example, the type, number, or wavelength of the light source. The mold 7 is a mold on which a predetermined pattern (for example, a three-dimensional pattern, such as a circuit pattern) is three-dimensionally formed on a surface opposite to the wafer 8. The material of the mold 7 is, for example, quartz capable of transmitting ultraviolet light.

The mold holder 4 holds the mold 7 by attracting it by a vacuum suction force or an electrostatic force. The mold holder 4 includes a mold chuck, a driving mechanism for driving the mold chuck in the z direction in order to press the mold 7 against the resin 9, and a correction mechanism for correcting the distortion of a pattern to be transferred to the resin 9 by deforming the mold 7 in the x and y directions.

The mold 7 and the wafer 8 form first and second objects spaced apart from each other in the z direction in the x-y-z coordinate system. The imprint and release operations of the imprint apparatus 1 can be implemented by moving the mold 7 in the z direction. These operations may, however, also be implemented by moving, for example, the wafer stage 5 in the z direction, or by moving both the mold 7 and the wafer stage 5. The wafer stage 5 holds the wafer 8 by, for example, vacuum suction, and can move in the x-y plane. The wafer 8 is made of, for example, single-crystal silicon, and the surface to be processed of the wafer 8 is coated with the ultraviolet-curing resin 9 to be molded by the mold 7.

The imprint apparatus 1 includes the detectors 3 for detecting the relative positional relationship between the mold 7 and the wafer 8. The detectors 3 detect the relative positions of the mold 7 and the wafer 8 by optically detecting first and third marks 10 formed on the mold 7 and second and fourth marks 11 formed on the wafer 8. The optical axis of the detector 3 is set perpendicular to the surface of the wafer 8. The detector 3 is designed so as to be drivable in the x and y directions in accordance with the positions of the marks 10 and 11 formed on the mold 7 and wafer 8. Also, the detector 3 is designed so as to be drivable in the z direction, as well, in order to focus the optical system on the positions of the marks 10 and 11. The driving of the wafer stage 5 and the correction mechanism of the mold 7 is controlled based on the relative positions of the mold 7 and the wafer 8 detected by the detector 3. The detector 3 and alignment marks 10 and 11 will be described in detail later.

The coating unit 6 coats the wafer 8 with the uncured resin 9. The resin 9 is a light curable resin that cures when receiving ultraviolet light, and is properly selected in accordance with, for example, the type of semiconductor device. The coating unit 6 need not always be installed inside the imprint apparatus 1, as shown in FIG. 11. That is, it is also possible to prepare a coating apparatus outside of the imprint apparatus 1, and to load the wafer 8 coated with the resin 9 by this coating apparatus into the imprint apparatus 1. In this case, the processing speed of the imprint apparatus 1 can be increased, because no coating step need be performed inside the imprint apparatus 1. In addition, the manufacturing cost of the whole imprint apparatus 1 can be reduced, because the coating unit 6 is unnecessary.

The imprinting process performed by the imprint apparatus 1 will be explained below. A controller C causes a substrate transporter (not shown) to transport the wafer 8 to the wafer stage 5, and to fix the wafer 8 on the wafer stage 5. Subsequently, the controller C moves the wafer stage 5 to the coating position of the coating unit 6, and the coating unit 6 coats a predetermined shot (imprint region) of the wafer 8 with the resin 9 as a coating step. Then, the controller C moves the wafer stage 5 so that the coating surface of the wafer 8 is positioned immediately below the mold 7.

The controller C drives the mold driving mechanism to imprint the mold 7 against the resin 9 on the wafer 8 (an imprint step). In this state, the resin 9 flows along the pattern surface 7a formed on the mold 7 by imprinting of the mold 7. In addition, the detectors 3 detect the marks 10 and 11 formed on the wafer 8 and the mold 7, and the controller C performs, for example, alignment of the mold 7 and the wafer 8 by driving the wafer stage 5, and correction by the correction mechanism of the mold 7. When the resin 9 sufficiently flows to the pattern surface 7a and the alignment of the mold 7 and wafer 8, the correction of the mold 7, and the like, are sufficiently performed, the ultraviolet radiation unit 2 radiates ultraviolet light from the back surface (upper surface) of the mold 7, thereby curing the resin 9 by ultraviolet light transmitted through the mold 7 (a curing step). In this step, the detectors 3 are retracted so as not to intercept the optical path of the ultraviolet light. Subsequently, the mold driving mechanism is driven again to release the mold 7 from the wafer 8 (a release step), thereby transferring the three-dimensional pattern of the mold 7 onto the wafer 8.

Figure 2:
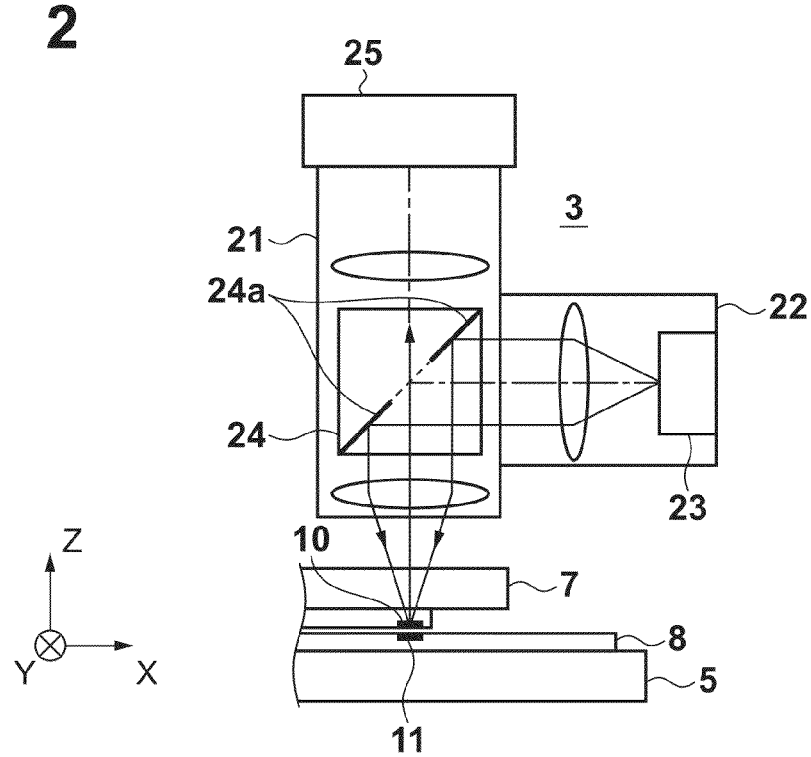
FIG. 2 is a view showing an example of a detector according to the first embodiment.

Details of the detector 3, and the marks 10 and 11, formed on the mold 7 and the wafer 8 will now be explained. FIG. 2 shows an example of the arrangement of the detector 3 of this embodiment. The detector 3 includes a detection optical system 21 and an illumination optical system 22. The illumination optical system 22 guides light from a light source 23 onto the same optical axis as that of the detection optical system 21 by using a prism 24, or the like, and obliquely illuminates the marks 10 and 11 at the same time.

A halogen lamp, LED, or the like, is used as the light source 23, and the light source 23 is designed so as to emit visible light or infrared light not containing ultraviolet light that cures the resin 9. The detection optical system 21 and illumination optical system 22 are designed so as to share some optical members forming these systems, and the prism 24 is positioned in or near the pupil planes of the detection optical system 21 and the illumination optical system 22. The marks 10 and 11 are each formed by a grating pattern, and the detection optical system 21 forms, on an image sensing element 25, an image of interfering light (an interference fringe or moire fringe) generated by interference between diffracted light components diffracted by the marks 10 and 11 illuminated by the illumination optical system 22. A CCD, a CMOS, or the like, is used as the image sensing element 25.

Figure 3:
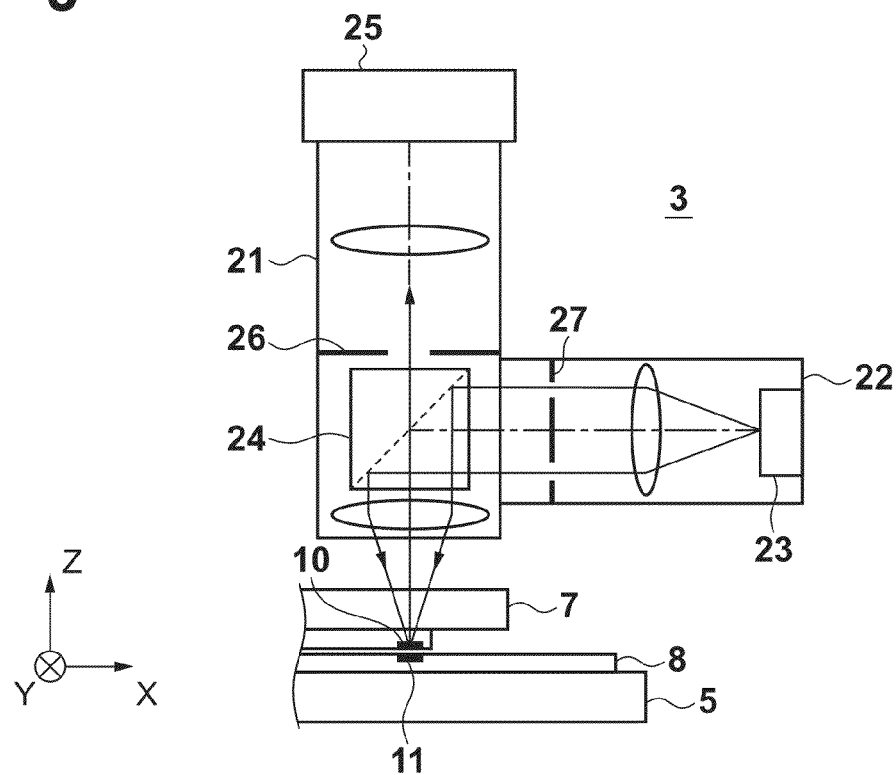
FIG. 3 is a view showing another example of the detector according to the first embodiment.

The prism 24 has, on its bonded surface, a reflecting film 24a for reflecting light from the periphery of the pupil plane of the illumination optical system 22. The reflecting film 24a also functions as an aperture stop for defining the size (or a detection NA: $NA_O$) of the pupil of the detection optical system 21. The prism 24 may also be a half prism having a semi-transparent film on the bonded surface, or an optical element other than a prism, for example, a plate-like optical element having a reflecting film on the surface. The prism 24 according to this embodiment need not always be positioned in or near the pupil planes of the detection optical system 21 and the illumination optical system 22. In this case, as shown in FIG. 3, the detection optical system 21 has an aperture stop 26 in the pupil plane, and the illumination optical system 22 has an aperture stop 27 in the pupil plane. Also, a half prism having a semi-transparent film on the bonded surface, for example, is uses as the prism 24.

Figure 4:
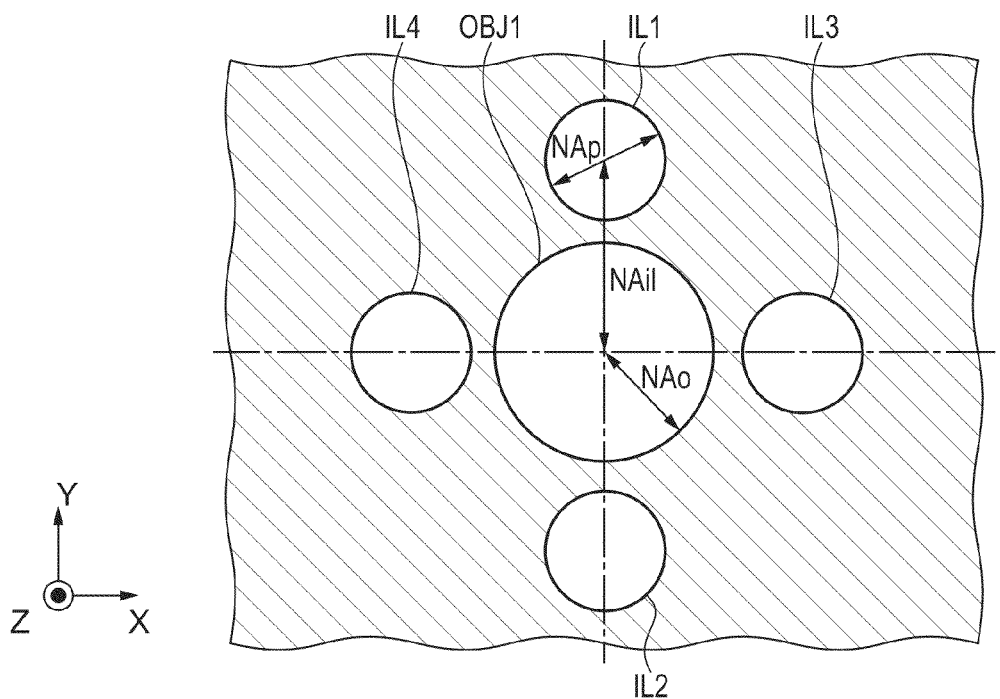
FIG. 4 is a view showing the pupil distributions of the illumination optical system and the detection optical system according to the first embodiment.

FIG. 4 shows the relationship between a light intensity distribution (effective light source distribution) formed in the pupil plane of the illumination optical system 22 and a first direction aperture $OBJ_1$ of the detection optical system 21. The illumination optical system 22 forms a light intensity distribution including first, second, third, and fourth poles $IL_1$, $IL_3$, $IL_2$, and $IL_4$ in the pupil plane. The first pole $IL_1$ has a diameter $NA_{P1}$ and has coordinates $(0, NA_{i11})$ as a central position. The second pole $IL_3$ has a diameter $NA_{P2}$ and has coordinates $(NA_{i12}, 0)$ as a central position. The third pole $IL_2$ has the diameter $NA_{P1}$ and the coordinates $(0, -NA_{i11})$ as a central position. The fourth pole $IL_4$ has the diameter $NA_{P2}$ and has coordinates $(-NA_{i12}, 0)$ as a central position. Note that, in this embodiment, the first to fourth poles $IL_1$ to $IL_4$ are circular poles having $NA_{P1}=NA_{P2}=NA_P$ as diameters. Also, $NA_{i11}=NA_{i12}=NA_{i1}$. The first detection aperture $OBJ_1$ has the numerical aperture $NA_O$ and has coordinates $(0, 0)$ as a central position in the pupil plane of the detection optical system 21.

The illumination optical system 22 is designed so as to obliquely illuminated the marks 10 and 11. An incident angle θ to the marks 10 and 11 is represented by:

$$\theta = \sin^{-1}(NA_{i1}). \quad (1)$$

The illumination optical system 22 and the detection optical system 21 are designed such that $NA_O$, $NA_P$, and $NA_{i1}$ satisfy expression (2) below. That is, the detector 3 has a dark field arrangement in which specular reflection light (0th-order diffracted light) from the alignment marks 10 and 11 is not detected.

$$NA_{i11} > NA_O + NA_{P1}/2 \text{ and } NA_{i12} > NA_O + NA_{P2}/2 \quad (2)$$

Since $NA_{i11}=NA_{i12}+NA_{i1}$ and $NA_{P1}=NA_{P2}=NA_P$ in this embodiment, expression (2) is expressed as:

$$NA_{i1} < NA_O + NA_P/2. \quad (2)'$$

Figure 5:
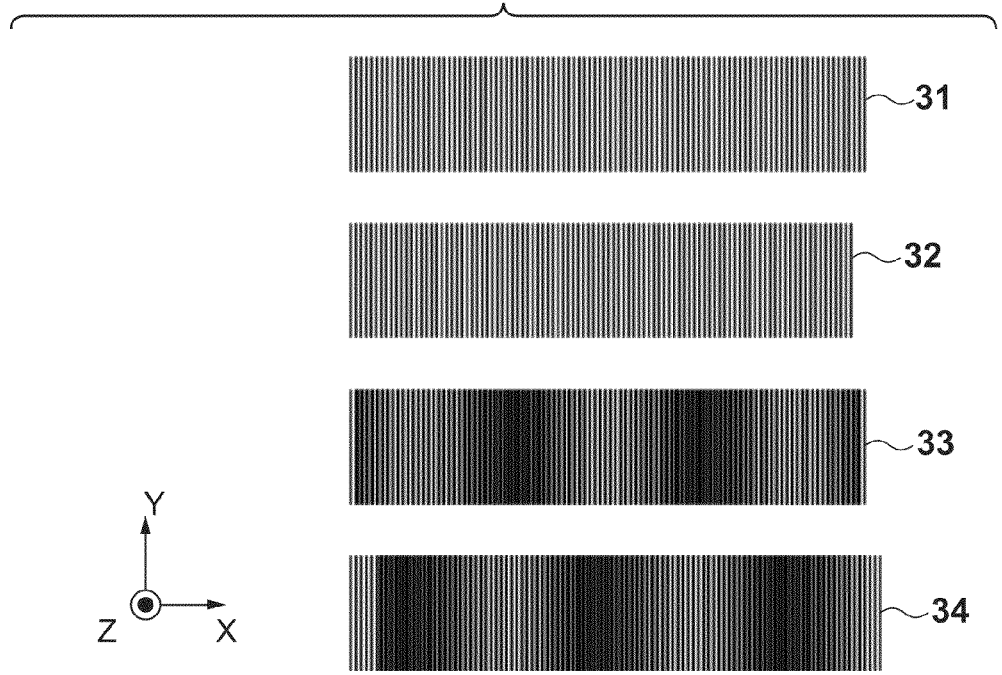
FIG. 5 is a view showing marks that generate a moire fringe.

The principle of the generation of a moire fringe and the detection of the relative positions of the mold 7 and the wafer 8 performed using the moire fringe will be explained below. When grating patterns 31 and 32, having slightly different grating pitches, as indicated in FIG. 5, are overlaid with each other, diffracted light components from the two grating patterns 31 and 32 interfere with each other and generate an interference fringe 33 (moire fringe) having a period reflecting the difference between the grating pitches. This moire fringe changes the positions of brightness and darkness (the fringe phase) in accordance with the relative positional relationship between the two grating patterns 31 and 32. For example, when one grating pattern is slightly shifted, the moire fringe 33 changes, as indicated by reference numeral 34. The moire fringe is generated as a fringe having a large period by enlarging the actual relative positional shift between the grating patterns 31 and 32. Even when the resolving power of the detection optical system 21 is low, therefore, the relative positional relationship between two objects can accurately be measured.

Figure 6:
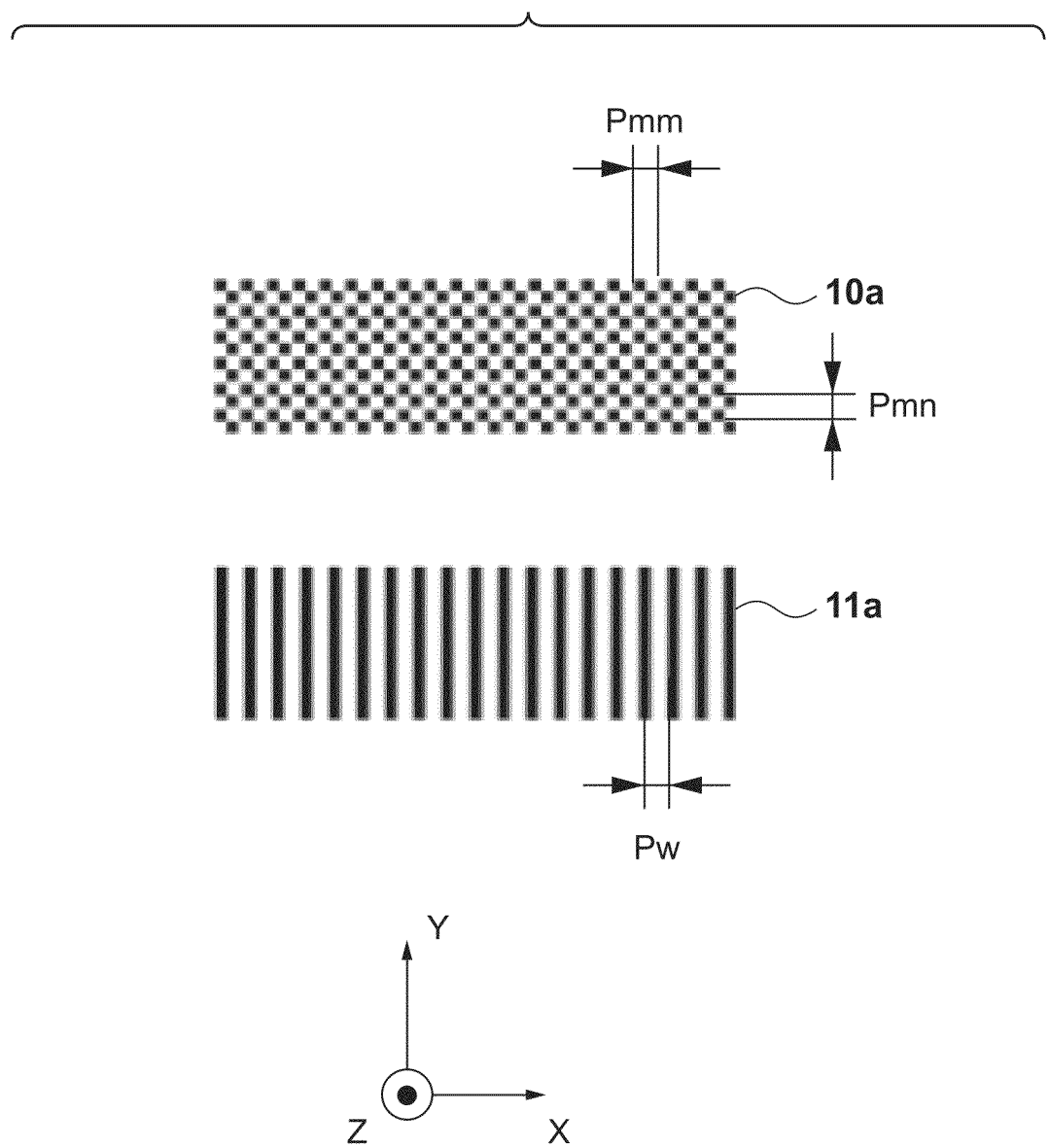
FIG. 6 is a view showing x-direction alignment marks according to the first embodiment.

When detecting the grating patterns 31 and 32 in a bright field (when illuminating the patterns in the vertical direction and detecting diffracted light in the vertical direction) in order to detect a moire fringe (interfering light), the detector 3 detects the 0th-order diffracted light from the grating pattern 31 or 32 as well. The 0th-order diffracted light from one of the grating patterns 31 and 32 decreases the contrast of the moire fringe. Therefore, the detector 3 of this embodiment has the dark field arrangement that does not detect any 0th-order diffracted light, as described previously. To detect a moire fringe by this dark field arrangement that performs oblique illumination, a checkerboard grating pattern 10a, as indicated in FIG. 6, is used as one of the mold and wafer marks 10 and 11, and the grating pattern 31 or 32, as indicated in FIG. 5, is used as the other. Although there is basically no difference regardless of which of the mold mark 10 or the wafer mark 11 is the checkerboard grating pattern, an arrangement in which the mold mark 10 is the checkerboard grating pattern will be explained below.

FIG. 6 indicates the mold mark (first mask) 10 and the wafer mark (second mark) 11 for detecting the relative positions of the mold 7 and the wafer 8 in the x direction. The mold mark 10 includes a checkerboard grating pattern 10a having a grating pitch of $P_{mn}$ ($P_1$) in the y direction and a grating pitch of $P_{mm}$ ($P_2$) in the x direction. The wafer mark 11 includes a grating pattern 11a having a grating pitch of $P_w$ ($P_3$) different from $P_{mn}$ in only the x direction. The principle of detecting a moire fringe (interfering light) by the detector 3 while the two grating patterns 10a and 11a are overlaid on each other will be explained with reference to FIGS. 7A to 7D.

Figure 7A:
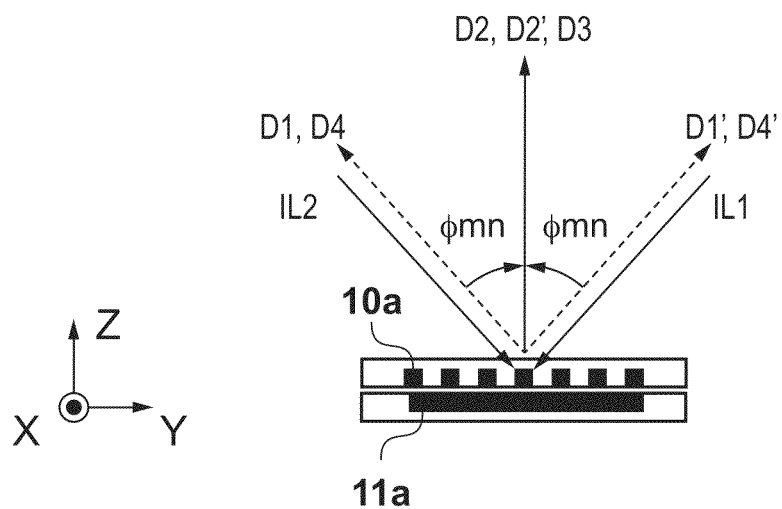
FIGS. 7A to 7D are views showing diffracted light in the first embodiment.
Figure 7B:
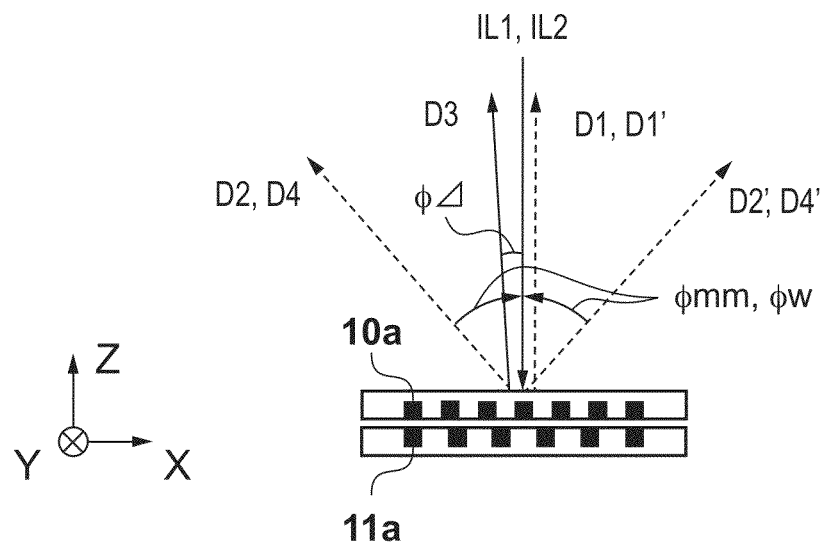

FIGS. 7A and 7B are views showing the grating patterns 10a and 11a in the x and y directions, respectively. A moire fringe for detecting relative positions in the x direction is generated by the intensity distributions $IL_1$ and $IL_2$ of the first and third poles arranged on the y-axis in the pupil plane. Letting d be the grating pitch, λ be the wavelength of light emitted from the illumination optical system 22, and n be the order of diffraction, a diffraction angle ϕ of the grating patterns 10a and 11a is represented by:

$$\sin \phi = n\lambda/d. \quad (3)$$

Accordingly, letting $\phi_{mm}$ and $\phi_{mn}$ be the diffraction angles of the grating pattern 10 in the x and y directions, respectively, and $\phi_w$ be the diffraction angle of the grating pattern 11a, expressions (4) to (6) below hold.

$$\sin \phi_{mm} = n\lambda/P_{mm} \quad (4)$$

$$\sin \phi_{mn} = n\lambda/P_{mn} \quad (5)$$

$$\sin \phi_w = n\lambda/P_w \quad (6)$$

Referring to FIG. 7A, the grating patterns 10a and 11a are obliquely illuminated in the y direction (non-measurement direction) by the intensity distributions $IL_1$ and $IL_2$ of the first and third poles arranged on the y-axis as the non-measurement direction in the pupil plane. Light components (0th-order light components) D1 and D1' specularly reflected by the grating patterns 10a and 11a are not incident on the detection optical system 21 because the detector 3 satisfies expression (2).

D2 and D2' indicate light components diffracted by the ±first orders by only the mold grating pattern 10a, and D3 indicates diffracted light diffracted by the +/− first order by the mold grating pattern 10a and diffracted by the −/+ first order by the wafer grating pattern 11a. The detector 3 uses the diffracted light D3 when detecting the relative positions of the mold 7 and the wafer 8. The light components D2, D2', and D3 diffracted at the angle $\phi_{mm}$ by the mold grating pattern 10a having the grating pitch $P_{mn}$ in the y direction are output at an angle at which they are detected by the detection optical system 21 with respect to the y-axis.

In this embodiment, to detect the diffracted light D3 that has a high diffraction intensity among diffracted light except for the 0th-order diffracted light and is diffracted by the +/− first order by the grating pattern 10a and diffracted by the −/+ first order by the grating pattern 11a, $P_1$, $NA_O$, $NA_{i11}$, and $NA_{P1}$ of the detector 3 satisfy the following conditions. $P_{mn}$, $NA_O$, $NA_{i1+}$, and $NA_P$ satisfy expression (7) below. In other words, diffracted light in the y direction can be detected at the wavelength within a range meeting expression (7).

$$|NA_{i11} - |\sin \phi_{mn}|| = |NA_{i1} - \lambda/P_1| < NA_O + NA_{P1}/2 \quad (7)$$

Since $P_1 = P_{mn}$, $NA_{i11} = NA_{i1}$, and $NA_P$ in this embodiment, expression (7) is expressed by:

$$|NA_{i11} - |\sin \phi_{mn}|| = |NA_{i1} - \lambda/P_{mn}| < NA_O + NA_{P1}/2 \quad (7')$$

The diffracted light D3 can most efficiently be detected when it is perpendicular to the y direction. Therefore, letting $\lambda_C$ be the central wavelength of illumination light output from the light source, it is desirable to adjust the illumination conditions of the illumination optical system 22 and the grating pitch $P_{mn}$ of the mold grating pattern 10a so as to satisfy $$NA_{i1} - \lambda_C/P_{mn} = 0 \quad (8)$$

As described above, the mold grating pattern 10a is obliquely illuminated in the y direction (non-measurement direction), and diffracted light diffracted in the non-measurement direction by the grating pattern 10a is detected. Next, diffracted light in the x direction (measurement direction) will be explained with reference to FIG. 7B. The light intensity distributions $IL_1$ and $IL_2$ of the first and third poles arranged on the y-axis of the pupil plane are incident on the grating patterns 10a and 11a in the direction perpendicular to the x-axis. As the same +/− first-order diffracted light as in the y direction, the diffracted light D3 diffracted by the +/− first order by the mold grating pattern 10a and diffracted by the −/+ first order by the wafer grating pattern 11a is incident on the detection optical system 21 at a small angle to the x-axis because $P_{mn}$ and $P_w$ are close.

Figure 7C:
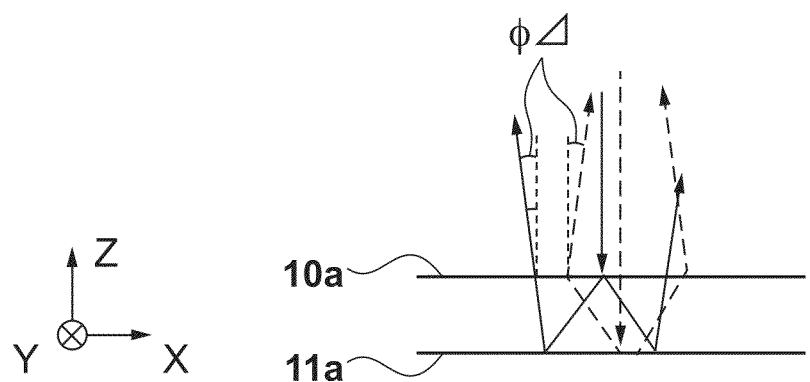

FIG. 7C shows the way the diffracted light D3 is diffracted. Each solid-line arrow indicates light diffracted by the +/− first order by the mold grating pattern 10a, diffracted by the −/+ first order by the wafer grating pattern 11a, and transmitted through the mold 7. Also, each dotted-line arrow represents diffracted light transmitted through the mold grating pattern 10a, diffracted by the −/+ first order by the wafer grating pattern 11a, and diffracted by the +/− first order by the mold grating pattern 10a. A diffraction angle $\phi_A$ of the diffracted light D3 in this state is represented by:

$$\sin \phi_A = \lambda \times |P_w - P_{mn}|/(P_{mn} P_w) \quad (9)$$

Substituting $1/P_A$ for $|P_w - P_{mn}|/(P_{mn} P_w)$ in expression yields:

$$\sin \phi_{66} = \lambda/P_A \quad (10)$$

Expression (10) means that the diffracted light D3 generates an interference fringe having a period $P_A$. This interference fringe is a moire fringe, and its period depends on the difference between the grating pitches of the mold grating pattern 10a and the wafer grating pattern 11a. Since, however, the mold grating pattern 10a is a checkerboard pattern in this embodiment, the period of the generated moire fringe is $P_A/2$. The relative positional difference between the mold 7 and the wafer 8 is enlarged into the positional difference between brightness and darkness of the moire fringe. Therefore, alignment can accurately be performed even when using the detection optical system 21 having a low resolving power.

The light components D2 and D2' diffracted by the first order by only the mold grating pattern 10a or light components D4 and D4' diffracted by the first order by only the wafer grating pattern 11a are output at the angle $\phi_{mn}$ or $\phi_w$ (FIG. 7B). Since D2, D2', D4, and D4' do not generate any moire fringe, but produce noise, the detection optical system 21 desirably detects none of them. In this embodiment, therefore, the grating pitches $P_2$ and $P_3$ of the grating patterns 10a and 11a and the numerical aperture $NA_O$ of the first detection aperture $OBJ_1$ of the detector 3 are adjusted so as to satisfy:

$$\lambda/P_2 = |\sin \phi_{mn}| > NA_O + NA_{P1}/2 \quad (11)$$

$$\lambda/P_3 = |\sin \phi_w| > NA_O + NA_{P1}/2. \quad (12)$$

Since $P_2 = P_{mn}$, $P_3 = P_w$, and $NA_{P1} = NA_P$ in this embodiment, expressions (11) and (12) are expressed by:

$$\lambda/P_{mn} = |\sin \phi_{mn}| > NA_O + NA_P/2 \quad (11')$$

$$\lambda/P_w = |\sin \phi_w| > NA_O + NA_P/2. \quad (12')$$

Figure 7D:
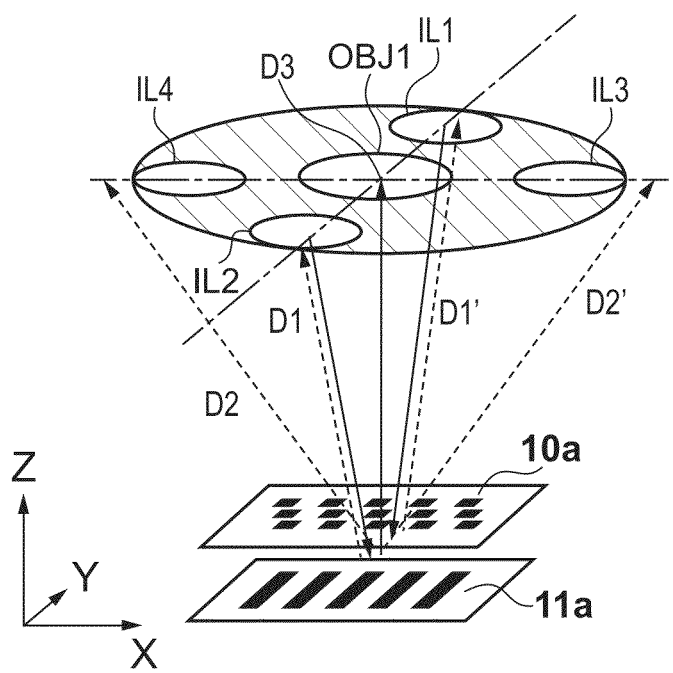

Light components (the 0th-order diffracted light components, D1 and D1' shown in FIG. 7B) not diffracted in the x direction by either of the mold grating pattern 10 and the wafer grating pattern 11a are output at an angle at which they are detected by the detection optical system 21 with respect to the x-axis. Also, diffracted light components D5 and D5' not diffracted by the wafer grating pattern 11a and diffracted by the +/− nth order and −/+ nth order (the 0th order in total) in the x direction by the mold grating pattern 10a before and after they are reflected by the wafer 8 are output at an angle at which they are detected by the detection optical system 21 with respect to the x-axis. The diffracted light components D5 and D5' generate no moire fringe and decrease the contrast of a moire fringe. Since, however, the mold grating pattern 10a is a checkerboard pattern in this embodiment, the phases of the diffracted light component D5 and D5' from adjacent gratings are shifted by Π, so these light components cancel each other. Accordingly, the intensity of the diffracted light components D5 and D5' is decreased, and a moire fringe can be measured at a high contrast. FIG. 7D is a view three-dimensionally representing FIGS. 7A and 7B. Note that the diffracted light components D5 and D5' are not shown, because the intensity is decreased.

Figure 8:
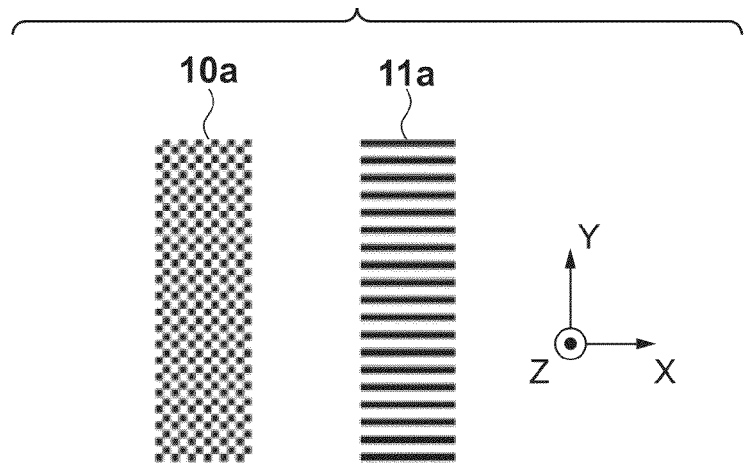
FIG. 8 is a view showing y-direction alignment marks according to the first embodiment.

Moire fringe detection for detecting the relative positions of the mold 7 and the wafer 8 in the x direction has been explained above. Moire fringe detection for detecting relative positions in the y direction is basically the same, except that the mark and illumination directions are switched for x and y. That is, a checkerboard grating pattern 10b having a grating pitch $P_5$ ($P_{mn}$) in only the y direction is used as the fourth mark 11 for wafer alignment in the y direction (FIG. 8). Also, a moire fringe for relative positional detection in the y direction is generated by illuminating the two grating patterns 10b and 11b described above with the light intensity distributions of the second pole $IL_3$ and the fourth pole $IL_4$ arranged on the x-axis in the pupil plane.

Similar to expressions (7), (11), and (12), the following expressions must be met in order to detect relative positions in the y direction.

$$|NA_{i12} - |\sin \phi_{mn}|| = |NA_{i12} - \lambda/P_5| < NA_O + NA_{P2}/2$$

$$\lambda/P_4 = |\sin \phi_{mn}| > NA_O + NA_{P2}/2$$

$$\lambda/P_6 = |\sin \phi_w| > NA_O + NA_{P2}/2$$

The case in which the grating patterns 10a and 10b have the same grating pitch and the grating patterns 11a and 11b have the same grating pitch has been explained above, but the present invention is not limited to this. That is, the grating patterns 10a and 10b may have different grating pitches, and the grating patterns 11a and 11b may have different grating pitches. Furthermore, the distance $NA_{i11}$ from the optical axis of the detection optical system 21 to the center of the first and third poles $IL_1$ and $IL_2$ and the distance $NA_{i12}$ from the optical axis to the center of the second and fourth poles $IL_3$ and $IL_4$ may be different.

The detector 3 of this embodiment detects one moire fringe in the vertical direction by obliquely illuminating the alignment marks in two directions. This makes it possible to assure a twofold light amount when compared to a conventional detector that performs detection in an oblique direction by performing oblique illumination in one direction. Consequently, the detector 3 can accurately detect the relative positions of two objects. The detector 3 of this embodiment can detect diffracted light at the wavelength within the range meeting expression (7) as already described above, and this wavelength range is desirably as broad as possible. Accordingly, the illumination optical system 22 desirably illuminates the first and third marks 10 and second and fourth marks 11 with light having a plurality of wavelengths.

The second and fourth marks 11 formed on the wafer 8 are rarely exposed to the surface of the wafer 8, and are often formed inside a process in which a few to a few tens of layers are stacked. When a layer made of a transparent material is formed on the mark 11, so-called thin-film interference sometimes extremely decreases the intensity of light returning from the mark 11, depending on the wavelength of illumination light. In this case, the condition of thin-film interference can be avoided by changing the wavelength λ of the illumination light, and as a consequence, the mark 11 can be seen. Based on this, it is desirable to make the wavelength λ of the illumination light variable within a broad range, even when observation is performed using the detector 3, and to determine the conditions of best detection in accordance with the formation process of the wafer 8. The conditions to be determined are, for example, the grating pitches $P_1$ to $P_6$ of the marks, the numerical aperture $NA_O$, the central positions of the first and second poles, and the wavelength range and central wavelength of the illumination light. As the wavelength λ of the illumination light, it is possible to cut out a desirable wavelength band by a bandpass filter by using, as the light source 23, a light source having a plurality of wavelengths in a broad band such as a halogen lamp, or switch a plurality of single-color light sources, such as LEDs, having different central wavelengths.

Figure 9:
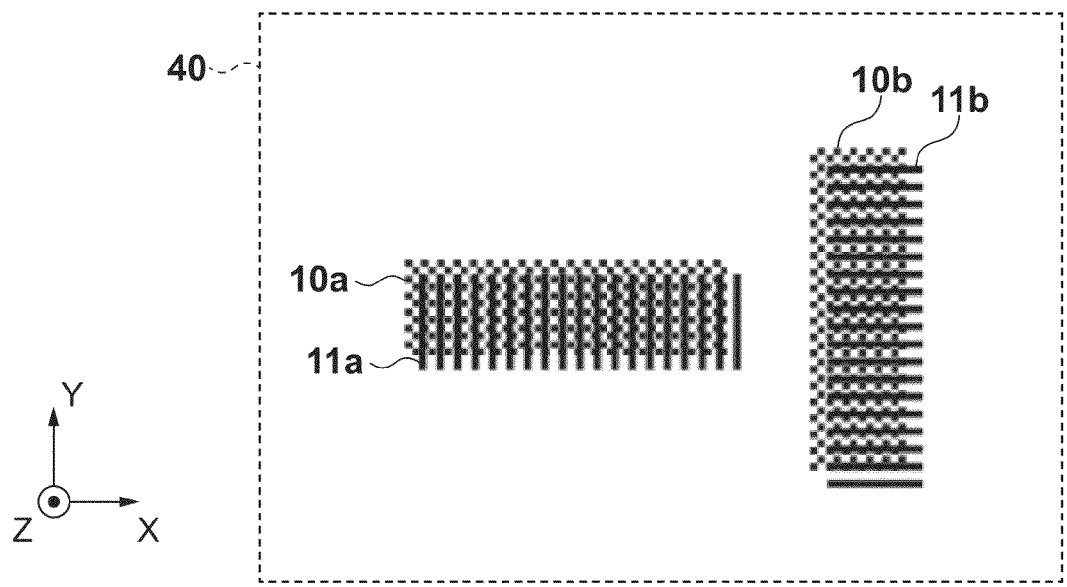
FIG. 9 is a view showing moire fringes for alignment in the x and y directions by using the detector according to the first embodiment.

As shown in FIG. 9, marks formed by overlaying the grating patterns 10a and 11a and the grating patterns 10b and 11b are simultaneously placed in a visual field 40 of the detector 3 having the light intensity distributions $IL_1$ to $IL_4$ of the illumination optical system 22 and the detection aperture $OBJ_1$, as shown in FIG. 4. Consequently, a single detector 3 can simultaneously observe moire fringes for alignment in the x and y directions. That is, in this embodiment, pieces of relative positional information in two direction can be acquired at the same time with a relatively inexpensive, simple apparatus configuration by using a single detector 3 (the detection signal system 21 and the illumination optical system 22).

In the method of performing alignment by simultaneously observing moire fringes in the x and y directions, the light intensity distributions of illumination light used in relative position detection in the x direction are the first and third poles $IL_1$ and $IL_2$ shown in FIG. 4; the second and fourth poles $IL_3$ and $IL_4$ are not used. Likewise, the light intensity distributions of illumination light used in relative positional detection in the y direction are the second and fourth poles $IL_3$ and $IL_4$ shown in FIG. 4, and the first and third poles $IL_1$ and $IL_2$ are not used. To simultaneously detect relative positions in the x and y directions, oblique illumination by illumination light must be performed in the y and x directions.

In this case, the light intensity distributions of illumination light not used in relative positional detection irradiate the alignment marks 10 and 11, and cause the marks 10 and 11 to generate diffracted light. If the detection optical system 21 detects this diffracted light, the contrast of a moire fringe used in relative positional detection decreases, and this sometimes decreases the measurement accuracy.

Figure 10A:
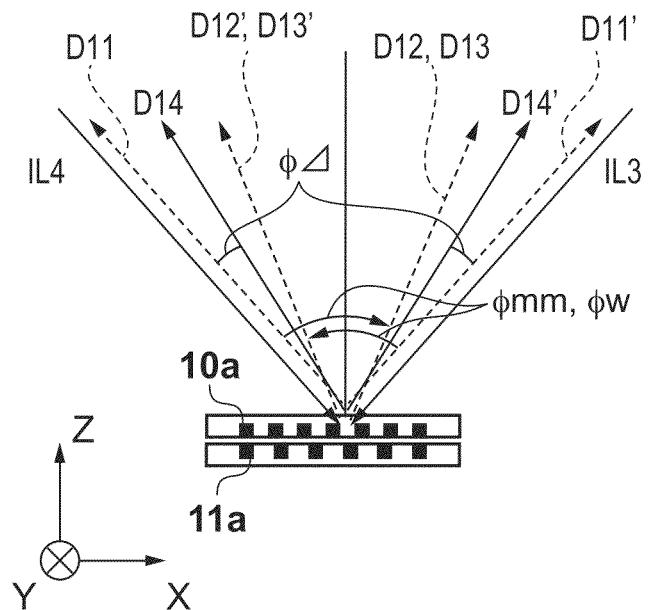
FIGS. 10A to 10C are views showing diffracted light in the first embodiment.
Figure 10B:
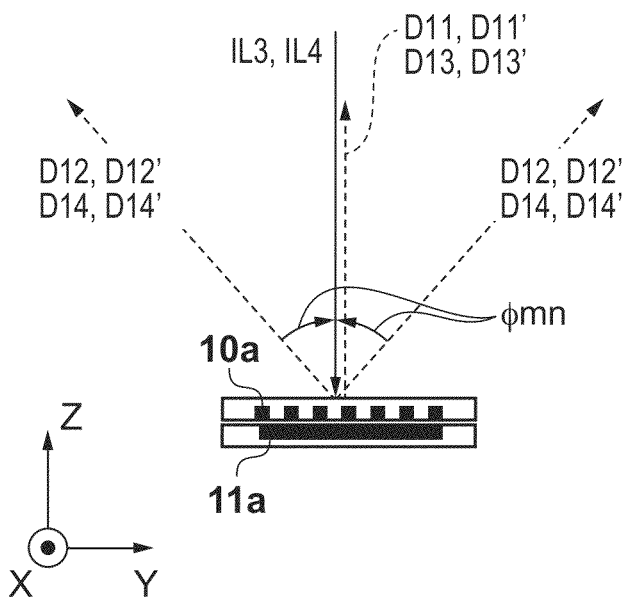
Figure 10C:
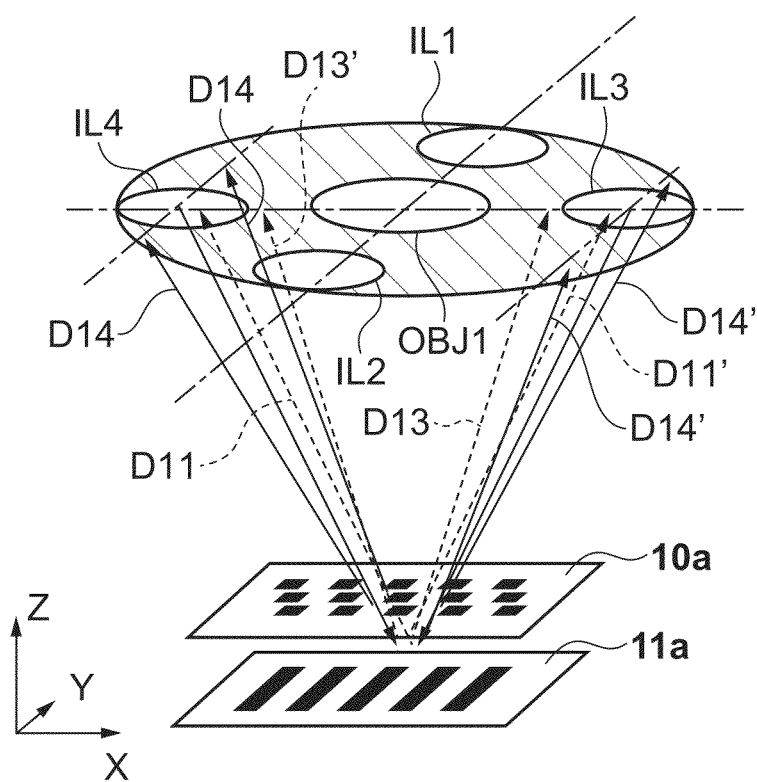

A case in which the first and second marks 10 and 11 for detecting the relative positions of the mold 7 and the wafer 8 in the x direction, shown in FIG. 6, are irradiated with the light intensity distributions ($IL_3$ and $IL_4$ shown in FIG. 4) of illumination light for detecting relative positions in the y direction will be explained with reference to FIGS. 10A to 10C. Referring to FIG. 10A, the grating patterns 10a and 11a are obliquely illuminated with the light intensity distributions $IL_3$ and $IL_4$ arranged on the x-axis as the measurement direction in the pupil plane. Specular reflection light components (0th-order diffracted light components) D11 and D11' from the grating patterns 10 and 11a are not incident on the detection optical system 21, because the detector 3 satisfies expression (2). D12 and D12' denote light components diffracted by the ±first order by only the mold grating pattern 10a having a period of $P_{mm}$ in the x direction and diffracted at an angle of $\phi_{mm}$. Since the mold grating pattern 10a is a checkerboard pattern in this embodiment, the phases of the diffracted light components D12 and D12' from adjacent gratings are shifted by Π, so these light components cancel each other. This makes it possible to decrease the intensity.

D13 and D13' denote light components diffracted by the ±first orders by only the wafer grating pattern 11a and diffracted at an angle of $\phi_w$. When the diffracted light components D13 and D13' satisfy expression (13) below, they are not incident on the detection aperture $OBJ_1$ and, hence, are not detected by the detection optical system 21.

$$|\lambda/P_2 - NA_{i12}| \geq NA_O + NA_{P2}/2$$

$$|\lambda/P_3 - NA_{i12}| \geq NA_O + NA_{P2}/2 \qquad (13)$$

Since $P_3 = P_w$, $NA_{i12} = NA_{i1}$, and $NA_{P2} = NA_P$ in this embodiment, expression (13) is expressed by $$|\lambda/P_w - NA_{i1}| \geq NA_O + NA_{P2}/2 \qquad (13')$$

Figure 1A:
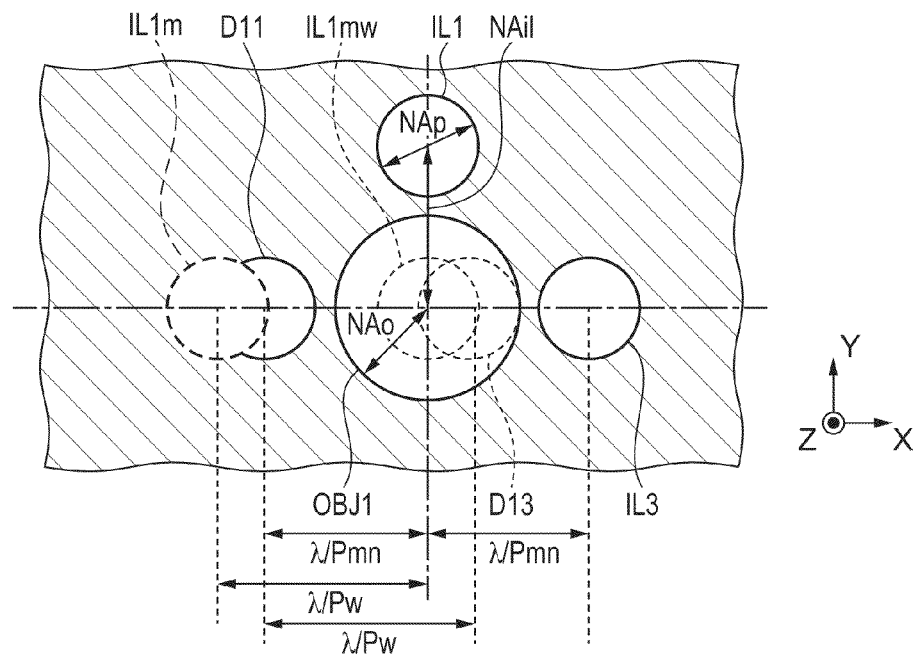
FIGS. 1A and 1B are views showing the pupil distributions of an illumination optical system and a detection optical system according to the first embodiment.
Figure 1B:
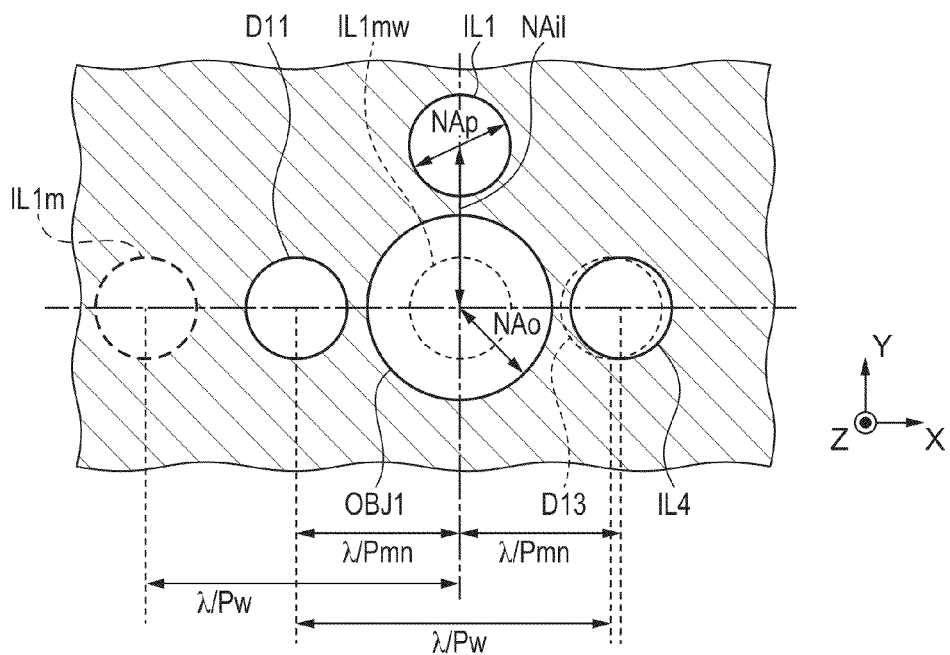

Expression (13') will be explained with reference to FIGS. 1A and 1B. FIGS. 1A and 1B illustrate the relationship between the detection aperture $OBJ_1$ and the light intensity distributions $IL_1$ and $IL_3$ of the illumination optical system 22. Referring to FIGS. 1A and 1B, the numerical aperture NA indicates the size of the pupil. The light intensity distributions of the illumination optical system 22 of this embodiment are formed by the two poles $IL_1$ and $IL_3$. Although FIGS. 1A and 1B show only the poles $IL_1$ and $IL_3$ for the sake of simplicity, relations can be obtained by the same way of thinking even when the poles $IL_2$ and $IL_4$, shown in FIG. 4, exist. Also, only light intensity distributions necessary for the convenience of explanation are shown for diffracted light. A light intensity distribution $IL_{1m}$ represents the light intensity distribution after the illumination light $IL_1$ in the y direction is diffracted by the mold grating pattern 10a. When the light intensity distribution $IL_{1m}$ is further diffracted by the wafer grating pattern 11a, diffracted light $IL_{1mw}$ enters the detection aperture $OBJ_1$, and the detection optical system 21 detects a moire fringe.

FIG. 1A shows the light intensity distributions of diffracted light when expression 13' is not met. That is, assume that the difference between the grating pitch $P_w$ of the wafer grating pattern 11a and the grating pitch $P_{mn}$ of the mold grating pattern 10a in the non-measurement direction is small. In this state, the diffracted light $IL_{1m}$ from the mold grating pattern 10a and the 0th-order diffracted light D11 of the illumination light $IL_3$, not used in the measurement, irradiate the wafer pattern 11a at almost the same incident angle. Consequently, the diffracted light D13 generated from the wafer grating pattern 11aq by the illumination light $IL_3$ not used in measurement is detected.

On the other hand, FIG. 1B shows the light intensity distributions of diffracted light when expression 13' is met. That is, the difference between the grating pitch $P_W$ of the wafer grating pattern 11a and the grating pitch $P_{mm}$ of the mold grating pattern 10a in the non-measurement direction is large ($P_w < P_{mn}$ in FIG. 1B). Accordingly, the diffracted light $IL_{1m}$ from the mold grating pattern 10a and the 0th-order diffracted light D11 of the illumination light $IL_3$ not used in measurement irradiate the wafer grating pattern 11a at different incident angles.

Consequently, the diffracted light D13 generated from the wafer grating pattern 11a by the illumination light $IL_3$ not used in measurement is diffracted outside the detection aperture $OBJ_1$ and, hence, is not detected. When $P_w > P_{mn}$, the second-order diffracted light or higher may be detected, but this diffracted light is weaker than the first-order diffracted light. Therefore, when expression (13') (or expression (13)) is met, it is no longer possible to detect the light that is at the 0th-order diffracted light from the mold grating pattern 10a and diffracted by the first order by the wafer grating pattern 11a. Consequently, relative positions in the x and y directions can be accurately measured.

Diffracted light components D14 and D14', shown in FIG. 10A, are diffracted light components diffracted by the +/− first order by the mold grating pattern 10a, and diffracted by the −/+ first order by the wafer grating pattern 11a. The diffraction angle $\phi_A$ in this state is represented by expression (9) as in FIG. 7B, and the interference fringe of the diffracted light components D14 and D14' is a moire fringe. Next, diffracted light in the y direction (non-measurement direction) will be explained with reference to FIG. 10B.

The diffracted light components D11 and D11' are light components not diffracted in the y direction by either of the mold grating pattern 10a and wafer grating pattern 11a, that is, the 0th-order diffracted light components. Also, D11 and D11' contain (totally 0th-order) diffracted light components diffracted by the +/− nth order when transmitted through the mold grating pattern 10a, not diffracted, but reflected by the wafer grating pattern 11a, and diffracted by the −/+ nth order in the y direction by the mold grating pattern 10a. D12, D12', D14, and D14', shown in FIG. 10B, indicate first-order diffracted light components from the mold grating pattern 10a. Each diffracted light is diffracted by the first order and output at the angle $\phi_{mn}$ with respect to the z-axis. FIG. 10C is a view three-dimensionally representing FIGS. 10A and 10B.

The case in which illumination light is emitted in a direction not used in the detection of a moire fringe for detecting the relative positions of the mold 7 and the wafer 8 in the x direction has been explained above. The detection of a moire fringe for detecting relative positions in the y direction is basically the same, except that the alignment marks and illumination directions are switched for x and y. Accordingly, expression (14), similar to expression (13), must be satisfied in measurement in the y direction.

$|\lambda/P_4 - NA_{i11}| \geq NA_O + NA_{P1}/2$ $|\lambda/P_6 - NA_{i1}| \geq NA_O + NA_{P1}/2$ \hfill (14)

The grating pitches of the grating patterns 10a and 10b may be different from each other, and the grating pitches of the grating patterns 11a and 11b may be different from each other. In addition, the distance from the optical axis to $IL_1$ and $IL_2$ and the distance from the optical axis to $IL_3$ and $IL_4$ may be different from each other. Note that the detector 3 of this embodiment can detect a moire fringe at a high contrast by removing diffracted light from illumination light not used in the detection of relative positions and having the wavelength $\lambda$ within the range meeting expressions (13) and (14) are already described above, and this wavelength range is desirably as broad as possible.

Figure 12:
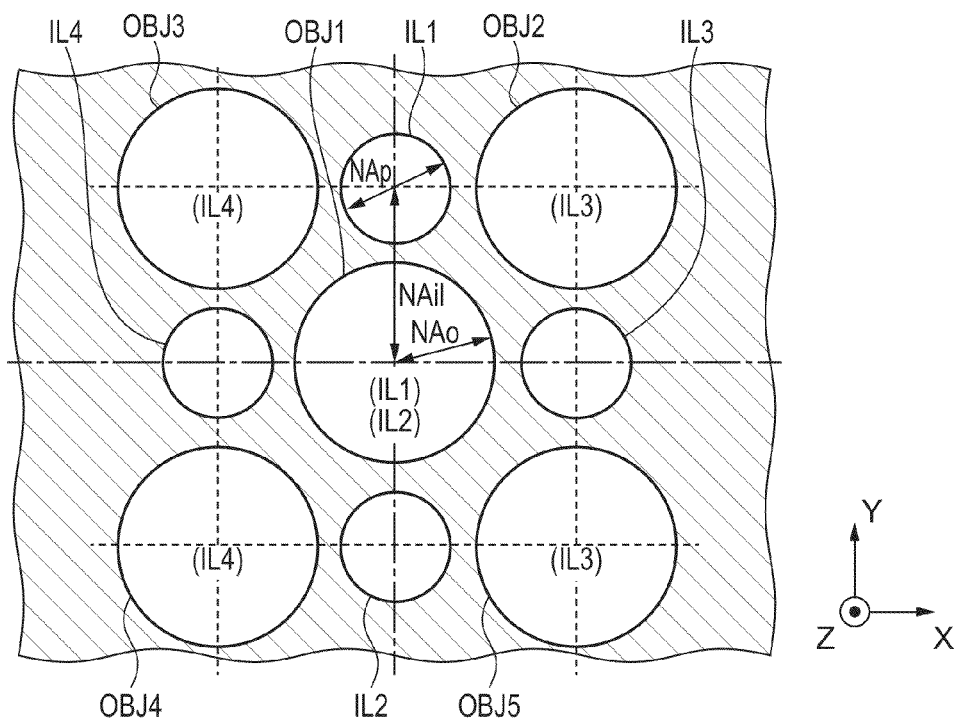
FIG. 12 is a view showing the pupil distributions of an illumination optical system and a detection optical system in a modification of the first embodiment.

FIG. 12 shows the relationship between the light intensity distributions of an illumination optical system 22 and the detection apparatuses of a detection optical system 21 according to a modification of the first embodiment. Referring to FIG. 12, the numerical aperture NA indicates the size of the pupil, as in FIG. 4. The light intensity distributions of the illumination optical system 22 of the modification of this embodiment include four poles $IL_1$ to $IL_4$. Each of the poles $IL_1$ to $IL_4$ is a circular pole having a diameter $NA_P$. First and third poles $IL_1$ and $IL_2$ are arranged in positions spaced apart by $NA_{i1}$ in the positive and negative directions, respectively, from the optical axis on the y-axis of the pupil plane. Second and fourth poles $IL_3$ and $IL_4$ are arranged in positions spaced apart by $NA_{i1}$ in the positive and negative directions, respectively, from the optical axis on the x-axis of the pupil plane.

$OBJ_1$ to $OBJ_5$ respectively denote first to fifth circular detection apertures, each having a diameter $NA_O$. The first detection aperture $OBJ_1$ is placed in the original position, and the second to fifth detection aperture $OBJ_2$ to $OBJ_5$ are arranged in positions spaced apart by $NA_{i11}$ or $NA_{i12}$ in the positive and negative directions from the x- and y-axes. That is, the second, third, fourth, and fifth detection apertures $OBJ_2$, $OBJ_3$, $OBJ_4$, and $OBJ_5$, respectively, have coordinates $(NA_{i11}, -NA_{i12})$, $(-NA_{i11}, NA_{i12})$, $(-NA_{i11}, -NA_{i12})$, and $(NA_{i11}, -NA_{i12})$ as central positions. The structure shown in FIG. 12 is obtained by additionally arranging the four detection apertures $OBJ_2$ to $OBJ_5$ at the four corners of the structure shown in FIG. 4.

A case in which marks for detecting relative positions in the x direction, shown in FIG. 6, are detected by using the light intensity distributions and detection apertures of a detector 3, shown in FIG. 12, will be explained below. As described previously, a moire fringe for detecting relative positions in the x direction, which is detected by the first detection aperture $OBJ_1$, shown in FIG. 12, is generated by the intensity distributions $IL_1$ and $IL_2$ arranged on the y-axis in the pupil plane.

Likewise, a moire fringe for detecting relative positions in the x direction, which is detected by the detection aperture $OBJ_2$, is generated by the intensity distribution $IL_3$ formed on the y-axis in the pupil plane. A moire fringe for detecting relative positions in the x direction, which is detected by the detection apertures $OBJ_3$ and $OBJ_4$, is generated by the intensity distribution $IL_41$. A moire fringe for detecting relative positions in the x direction, which is detected by the detection aperture $OBJ_5$, is generated by the intensity distribution $IL_3$. $IL_1$ to $IL_4$ in the parentheses described in the detection apertures shown in FIG. 12 indicate intensity distributions generated by moire fringes for detecting relative positions in the x direction, which are detected by these detection apertures.

The detection apertures are additionally arranged as described above in order to increase the light amount of a moire fringe for detecting relative positions. In the modification shown in FIG. 12, in which the detection apertures $OBJ_2$ to $OBJ_5$ are additionally arranged at the four corners, the light amount of a moire fringe for detecting relative positions is three times as large as that when using only the first detection apertures $OBJ_1$ at the center.

Figure 13:
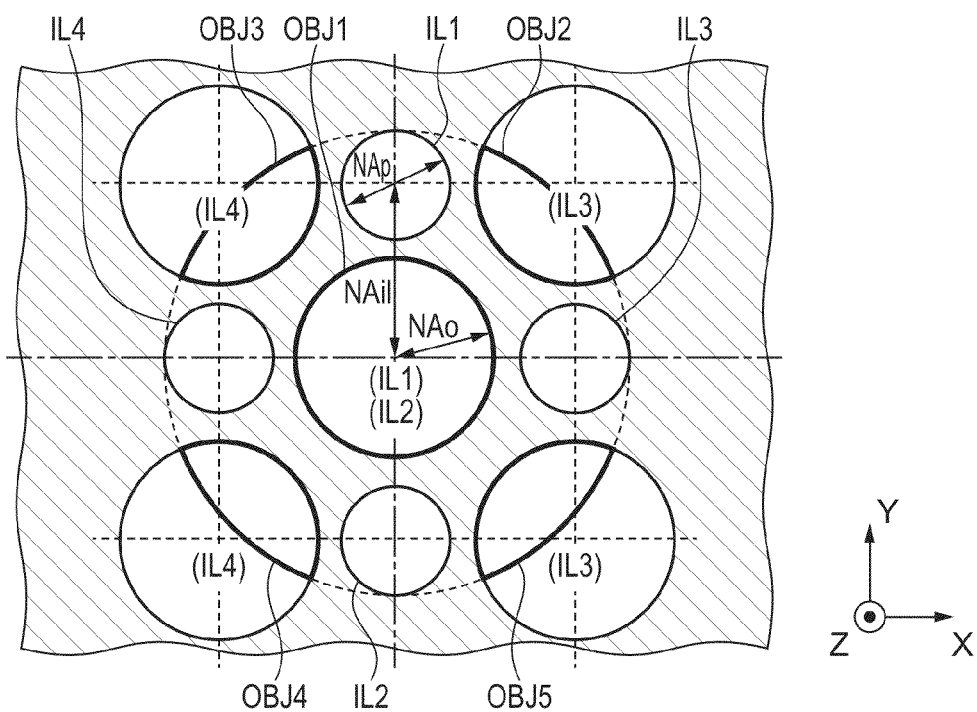
FIG. 13 is a view showing the pupil distributions of the illumination optical system and the detection optical system in the modification of the first embodiment.

FIG. 13 shows the relationship between the light intensity distributions of the illumination optical system 22 and the detection apertures according to the modification of the first embodiment. When the detection apertures are arranged at the four corners, as shown in FIG. 12, the NA range required for the detector 3 is enlarged, so the diameter of the detector 3 increases. By using the relationship between the light intensity distributions and detection apertures shown in FIG. 13, the light amount of a moire fringe for detecting relative positions to be detected can be increased when compared to that shown in FIG. 4, without changing the NA of the detector 3 from that shown in FIG. 4.

The detection apertures at the four corners shown in FIG. 13 exist inside a circle having coordinates (0, 0) as the center and a larger one of $(NA_{i11}+NA_{P1}/2)$ and $(NA_{i12}+NA_{P2}/2)$ as the radius, in regions inside the circles of the detection apertures at the four corners shown in FIG. 12. That is, a moire fringe for detecting relative positions is detected in the entire detection aperture $OBJ_1$ shown in FIG. 13, and detected within a region enclosed with solid lines in FIG. 13 in each of the detection apertures $OBJ_2$ to $OBJ_5$ at the four corners. When compared to the arrangement using only the first detection aperture $OBJ_1$ at the center, therefore, the light amount to be detected of a moire fringe for detecting relative positions increases.

Second Embodiment

Figure 14:
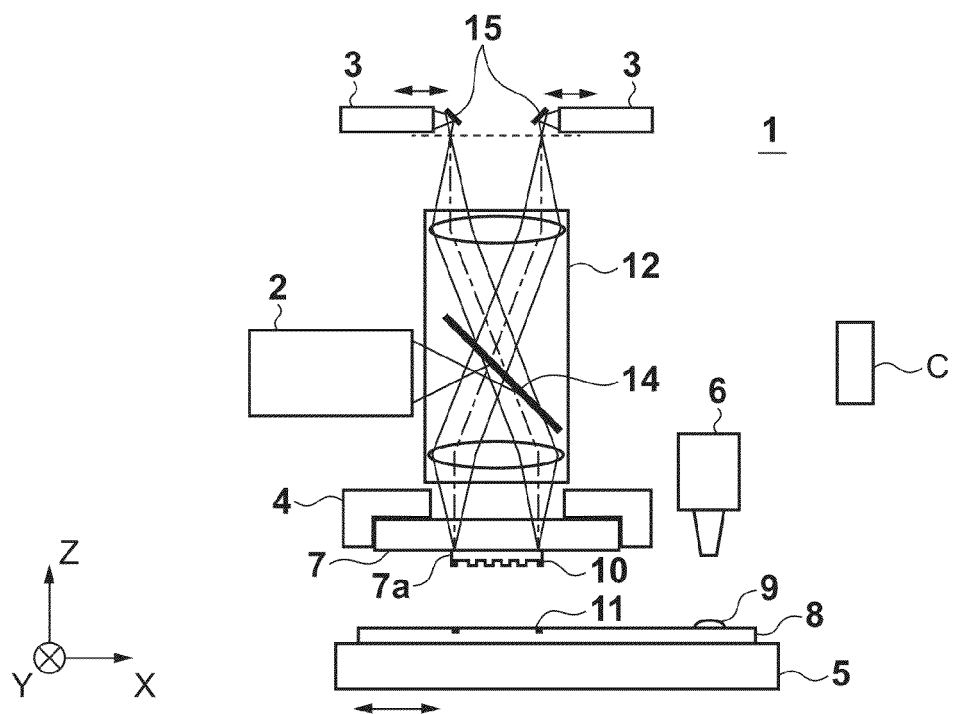
FIG. 14 is a view showing an imprint apparatus of the second embodiment.

An imprint apparatus 1 according to the second embodiment will be explained below with reference to FIG. 14. The arrangement and the method of an imprinting process of the imprint apparatus 1 of this embodiment are basically the same as those of the first embodiment, except that this apparatus further includes a projection optical system 12. The projection optical system 12 is arranged immediately above a mold 7, and projects images of alignment marks 10 and 11, respectively formed on the mold 7 and a wafer 8, onto a projection surface 13 of the projection optical system 12. Also, the projection optical system 12 incorporates a dichroic mirror 14. The dichroic mirror 14 is an optical member that selectively reflects or transmits light in accordance with its wavelength. For example, the dichroic mirror 14 is designed so as to reflect ultraviolet light that cures a resin 9, and transmits visible light or infrared light for illuminating the marks 10 and 11.

Detectors 3 illuminate the marks 10 and 11 on the mold 7 and the wafer 8 through the projection optical system 12 (and the dichroic mirror 14), and detect an image of a moire fringe projected onto the projection surface 13 of the projection optical system 12, thereby detecting the relative positions of the mold 7 and the wafer 8. An ultraviolet radiation unit 2 is designed so that the dichroic mirror 14 is irradiated with ultraviolet light from the side of the projection optical system 12, and ultraviolet light reflected by the dichroic mirror 14 and having a predetermined shape evenly irradiates a three-dimensional pattern through the interior of the projection optical system 12. Accordingly, an optical member between the mold 7 and the dichroic mirror 14 inside the projection optical system 12 is made of, for example, quartz that transmits ultraviolet light. In this arrangement, even when using the detector 3 set such that its optical axis is perpendicular to the mold 7 and the wafer 8, the detector 3 need not be retracted during ultraviolet irradiation. That is, the productivity of the imprint apparatus 1 can be increased because the time required for retracting the detector 3 is unnecessary.

The dichroic mirror 14 can also be designed so as to transmit ultraviolet light and to reflect visible light or infrared light. In this case, the optical path of the projection optical system 12 is bent by the dichroic mirror 14, and the positional relationship between the detectors 3 and the ultraviolet radiation unit 2 is the inverse of that shown in FIG. 14. That is, the ultraviolet radiation unit 2 is arranged above the mold 7. Also, in the imprint apparatus 1, according to this embodiment, bending mirrors 15 are arranged near the projection surface 13 of the projection optical system 12. The bending mirrors 15 bend illumination light emitted from the detectors 3 and diffracted light from the alignment marks 10 and 11, in a direction parallel to the X-Y plane at a position where the light beam diameter is small. Therefore, even when the NA of the detection optical system 21 or the illumination optical system 22 increases, because the wavelength range or the illumination light amount increases and, as a consequence, the diameter of the detector 3 increases, it is possible to arranged the detectors 3 close to teach other in the X and Y directions, and to increase the degree of freedom of the layout of the alignment marks 10 and 11.

When the projection optical system 12 is not used, it is necessary to arrange the detectors 3 in positions slightly apart from the mold 7 or to minimize the diameter of the detectors 3, in order to avoid interference with a mold driving mechanism of a mold holder 4 or a correction mechanism of the mold 7. When the detectors 3 are arranged in positions apart from the mold 7, the light beam diameter increases, so the detectors 3 are enlarged. As a consequence, the cost of the detectors 3 increases, and the limitations on the layout of the marks 10 and 11 that can be detected become more severe. On the other hand, when the diameter of the detectors 3 is decreased, the NA of the detection optical system 21 and illumination optical system 22 decreases, so the amount of light for illuminating the marks 10 and 11 reduces, or the bandwidth of the detection wavelength decreases. This decreases the accuracy of relative alignment of the mold 7 and the wafer 8.

When using the projection optical system 12 as described above, the NA of the projection optical system 21 and the illumination optical system 22 can be increased, without any interference with the mold driving mechanism and the correction mechanism of the mold 7, and any limitations on the layout of the marks 10 and 11. Consequently, it is possible to widen the detection wavelength range of the detector 3, and to increase the illumination light amount. This makes it possible to more accurately align the mold 7 and the wafer 8. Also, if an arrangement space can be assured, the detection optical system 21 and the illumination optical system 22 can be formed by different optical systems without using the projection optical system 12.

Third Embodiment

An article manufacturing method will be explained. A method of manufacturing a device (for example, a semiconductor integrated circuit element or a liquid crystal display element), as an article, includes a step of forming a pattern on a substrate (e.g., a wafer, a glass plate, or a film substrate) by using the above-described imprint apparatus 1. This manufacturing method can further includes a step of etching the substrate on which the pattern is formed. Note that, when manufacturing another article, such as a patterned medium (e.g., a recording medium) or an optical element, the manufacturing method can include another step of processing the substrate on which the pattern is formed, instead of etching. When compared to conventional methods, the article manufacturing method of this embodiment is advantageous in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A detector comprising:
an illumination optical system configured to illuminate a first grating having a period in each of a first direction and a second direction different from the first direction, and a second diffraction grating having a period in the second direction different from the period of the first diffraction grating in the second direction; and
a detection optical system configured to detect diffracted light diffracted by the first diffracted grating and the second diffraction grating illuminated by said illumination optical system, said detection optical system including a photoelectric conversion element and a guide portion arranged on a pupil plane of said detection optical system,
wherein said illumination optical system forms a first pole and a second pole on a pupil plane thereof,
the guide portion is configured to guide, to the photoelectric conversion element, the light diffracted by the first diffracting grafting and the second diffraction grating by illuminating the first diffraction grating and the second diffraction grating with the light from the first pole at an oblique incidence in the first detection, and
the diffracted light diffracted by the second diffraction grating by illuminating the first diffracting grating and the second diffracting grating with the light from the second pole at an oblique incidence in the second direction enters a position different from the guide portion on the pupil plane of the detection optical system.

2. The detector according to claim 1, wherein,
letting coordinates on the pupil plane be represented by a position in the first direction and a position in the second direction,
the first pole has a diameter $NA_{P1}$ and coordinates $(0, NA_{i11})$ as a central position in the pupil plane of said illumination optical system,
the second pole has a diameter $NA_{P2}$ and coordinates $(NA_{i12}, 0)$ as a central position in the pupil plane of said illumination optical system,
and the guide portion of said detection optical system has a radius $NA_O$ and coordinates $(0, 0)$ as a central position in the pupil plane of the detected optical system.

3. The detector according to claim 2, wherein relationships represented by $NA_{i11} > NA_O + NA_{P2}/2$ and $NA_{i12} > NA_O + NA_{P2}/2$ are satisfied.

4. The detector according to claim 2, wherein at least one of the grating pitch of one of the first diffraction grating, the grating pitch of the second diffraction grafting, the radius of the guide portion, the central position of the first pole, the central position of the second pole, a central wavelength of illumination light of said illumination optical system, and a wavelength range of the illumination light is determined based on one of an intensity and a contrast of diffracted light detected by said detection optical system.

5. The detector according to claim 2, wherein said illumination optical system forms, in the pupil plane thereof, a third pole having a diameter $NA_{P1}$ and coordinates $(0, -NA_{i11})$ as a central position, and a fourth pole having a diameter $NA_{P2}$ and coordinates $(-NA_{i12}, 0)$ as a central position.

6. The detector according to claim 5, wherein said detection optical system further includes, in a pupil plane thereof, four guide portions having a radius $NA_O$ and coordinates $(NA_{i11}, NA_{i12})$, $(-NA_{i11}, NA_{i12})$, $(-NA_{i11}, -NA_{i12})$, and $(NA_{i11}, -NA_{i12})$ as central positions, and guiding diffraction light to the photoelectric conversion element.

7. The detector according to claim 5, wherein said detection optical system further includes, in a pupil plane thereof, a guide portion inside a circle having coordinates $(0, 0)$ as a central position and a larger one of $(NA_{i11}+NA_{P1}/2)$ and $(NA_{i12}+NA_{P2})$ as a radius, in a region inside four circles having a radius $NA_O$ and coordinates $(NA_{i11}, NA_{i12})$, $(-NA_{i11}, NA_{i12})$, $(-NA_{i11}, -NA_{i12})$, and $(NA_{i11}, -NA_{i12})$ as central positions, and guiding diffraction light to the photoelectric conversion element.

8. The detector according to claim 2, wherein,
letting $\lambda$ be a wavelength of light emitted from said illumination optical system, $P_1$ be a period of the first diffraction grating in the first direction, $P_2$ be a period of the first diffraction grating in the second direction, and $P_3$ be a period of the second diffraction grating in the second direction,
relationship represented by $|\lambda/P3 - NA_{i12}| \geq NA_O + NA_{P2}/2$, $|\lambda/P2 - NA_{i12}| \geq NA_O + NA_{P2}/2$ and $|NA_{i11} - \lambda/P1| < NA_O + NA_{P1}/2$ are satisfied.

9. The detector according to claim 8, wherein relationships represented by $\lambda/P_2 > NA_O + NA_{P1}/2$ and $\lambda/P_3 > NA_O + NA_{P1}/2$ are further satisfied.

10. The detector according to claim 1, wherein said illumination optical system illuminates the first diffraction grating and the second diffraction grating with light having a plurality of wavelengths.

11. The detector according to claim 1, wherein at least one of a radius of the guide portion, a diameter of the first pole, a diameter of the second pole, and a wavelength of light emitted from said illumination optical system is a variable.

12. An imprint apparatus for contacting a pattern of a mold and a resin with which a substrate is dispensed, curing the resin, and forming a pattern of the cured resin on the substrate, the apparatus comprising a detector to according to claim 1,
wherein the detector detects
diffracted light diffracted by a diffracting grating;
formed on the mold, and diffracted light diffracted by a diffraction grating formed on the substrate.

13. The detector according to claim 1, wherein the detector is configured to obtain relative positions of the first diffraction grating and the second diffraction grating in the second direction based on the detected diffracted light.

14. The detector according to claim 1, wherein the detection optical system is configured to detect a moire fringe generated by diffracted light diffracted by the first diffraction grating and the second diffraction grating.

15. The detector according to claim 1, wherein the first direction and the second direction are perpendicular to each other.

16. The detector according to claim 1, wherein the guide portion includes an aperture.

17. The detector according to claim 1, wherein
said illumination optical system illuminates the first diffraction grating formed on a first object and the second diffraction grating formed on a second object, said illumination optical system illuminates a third diffraction grating having periods in each of the first direction and the second direction and formed on the first object, and a fourth diffraction grating having a period different from the period in the first direction of the third diffraction grating in the first direction and formed on the second object, said detection optical system detects diffracted light from the third diffraction grating and the fourth diffraction grating illuminated by said illumination optical system, the light diffracted by the third diffraction grating and the fourth diffraction grating by illuminating the third diffraction grating and the fourth diffraction grating with the light from the second pole at an oblique incidence in the second direction enters the guide portion and is guided to the photoelectric conversion element, and the light diffracted by the fourth diffraction grating by illuminating the third diffraction grating and the fourth diffraction grating with the light from the first pole at an oblique incidence in the first direction enters a position different from the guide portion on the pupil plane of the detection optical system.

18. The detector according to claim 17, wherein, letting $\lambda$ be a wavelength of light emitted from said illumination optical system, $P_4$ be a period of the third diffraction grating in the first direction, $P_5$ be a period of the third diffraction grating in the second direction, and $P_6$ be a period of the fourth diffraction grating in the first direction, relationships represented by $|\lambda/P4-NA_{i11}| \geq NA_O + NA_{P1}/2$, $|\lambda/P_6-NA_{i11}| \geq NA_O + NA_{P1}/2$, and $|NA_{i12}-\lambda/P5| < NA_O + NA_{P2}/2$ are satisfied.

19. The detector according to claim 18, wherein relationship represented by $\lambda/P_4 > NA_O + NA_{P2}/2$, and $\lambda/P6 > NA_O + NA_{P2}/2$ are further satisfied.

20. The detector according to claim 18, wherein the detector is configured to obtain relative positions of the first object and the second object in the first direction and the second direction based on the detected diffracted light.

21. The detector according to claim 17, wherein the grating pitch of one of the third diffraction grating and the fourth diffraction grating is determined based on one of an intensity and a contrast of diffracted light detected by said detection optical system.

22. A detector comprising:

an illumination optical system configured to illuminate a first diffraction grating having periods in each of a first direction and a second direction different from the first direction, and a second diffraction grating having a period in the second direction different from the period of the first diffraction grating in the second direction; and a detection optical system configured to detect diffracted light diffracted by the first diffraction grating and the second diffraction grating illuminated by said illumination optical system, wherein said illumination optical system forms a first pole and a second pole on a pupil plane thereof, said detection optical system detects the diffracted light diffracted by the first diffraction grafting and the second diffraction grafting by illuminating the first diffracting grafting and the second diffraction grafting with the light from the first pole at an oblique incidence in the first direction, and said detection optical system does not detect diffracted light diffracted by the second diffraction grating by illuminating the first diffracting grating and the second diffraction grating with light from the second pole at an oblique incidence in the second direction.

23. A method of manufacturing an article, the method comprising:

(a) forming a pattern on a substrate using an imprint apparatus; and (b) processing the substrate on which the pattern is formed in the forming to manufacture the article, wherein the imprint apparatus contacts a pattern of a mold against a resin with which a substrate is dispensed, cures the resin, and forms a pattern of the cured resin on the substrate, the imprint apparatus including a detector that includes:

(i) an illumination optical system configured to illuminate a first mark arranged on the first object, and a second mark arranged on the second object;

(ii) a detection optical system configured to illuminate a first diffraction grating having periods in each of a first direction and a second direction different from the first direction, and a second diffraction grafting having a period in the second direction different from the period of the first diffraction grafting in the second direction; and (iii) a detection optical system configured to detect diffracted light diffracted by the first diffracting grating and the second diffraction grating illuminated by the illumination optical system, wherein the illumination optical system forms a first pole and a second pole on a pupil plane thereof, the guide portion is configured to guide, to the photoelectric conversion element, the light diffracted by the first diffraction grating and the second diffraction grating by illuminating the first diffraction grating and the second diffraction grating with the light from the first pole at an oblique incidence in the first direction, and the diffracted light diffracted by the second diffraction grafting by illuminating the first diffraction grating and the second diffracting grating with the light from the second pole at an oblique incidence in the second direction enters a position different from the guide portion on the pupil plane of the detection optical system.

* * * * *